US010950439B2

(12) United States Patent
Azuma

(10) Patent No.: US 10,950,439 B2
(45) Date of Patent: Mar. 16, 2021

(54) PATTERN FORMING METHOD

(71) Applicant: TOSHIBA MEMORY CORPORATION, Tokyo (JP)

(72) Inventor: Tsukasa Azuma, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/567,738

(22) Filed: Sep. 11, 2019

(65) Prior Publication Data

US 2020/0294796 A1    Sep. 17, 2020

(30) Foreign Application Priority Data

Mar. 14, 2019   (JP) .............................. JP2019-047085

(51) Int. Cl.
*H01L 21/027* (2006.01)
*H01L 23/544* (2006.01)
(Continued)

(52) U.S. Cl.
CPC .... *H01L 21/0271* (2013.01); *H01L 21/02118* (2013.01); *H01L 21/31058* (2013.01);
(Continued)

(58) Field of Classification Search
CPC ........... H01L 21/0271; H01L 21/31144; H01L 21/31133; H01L 21/31058; H01L 22/20;
(Continued)

(56) References Cited

U.S. PATENT DOCUMENTS

2013/0309457 A1* 11/2013 Rathsack .............. G03F 7/0002
   428/195.1
2016/0254161 A1*  9/2016 Chan ................... H01L 21/3081
   438/702
(Continued)

FOREIGN PATENT DOCUMENTS

| JP | 2005-97442 A | 4/2005 |
| JP | 5284328 B2 | 9/2013 |
| JP | 6346115 B2 | 6/2018 |

OTHER PUBLICATIONS

Azuma et al., "Electrical yield verification of half-pitch 15 nm patterns using directed self-assembly of polystyrene-block-poly (methyl methacrylate)," J. Vacuum Sci. & Tech. B, vol. 33, No. 6, pp. 06F302-1-06F302-6 (2015).
(Continued)

*Primary Examiner* — Mohammed R Alam
(74) *Attorney, Agent, or Firm* — Finnegan, Henderson, Farabow, Garrett & Dunner, L.L.P.

(57) ABSTRACT

According to one embodiment, a pattern forming method is disclosed. The method includes forming a guide pattern, forming a block copolymer film that covers the guide pattern and includes first and second polymers, and forming a microphase-separation pattern including first portions of the first polymer and second portions of the second polymer which are alternately arranged by subjecting the block copolymer film to microphase separation. The method further includes measuring a position of the guide pattern, the first portions or the second portions by using a scanning probe microscope, determining whether a misalignment amount of the first portions with respect to the guide pattern is within a first range, based on the measured position of the first and the guide pattern, and removing the first portions, when the misalignment amount is within the first range.

20 Claims, 11 Drawing Sheets

(51) Int. Cl.
- *H01L 21/311* (2006.01)
- *H01L 21/02* (2006.01)
- *H01L 21/3105* (2006.01)
- *H01L 21/66* (2006.01)

(52) U.S. Cl.
CPC .. *H01L 21/31133* (2013.01); *H01L 21/31144* (2013.01); *H01L 22/20* (2013.01); *H01L 23/544* (2013.01); *H01L 2223/54426* (2013.01)

(58) Field of Classification Search
CPC ............. H01L 23/544; H01L 21/02118; H01L 2223/54426
See application file for complete search history.

(56) References Cited

U.S. PATENT DOCUMENTS

2016/0284560 A1 9/2016 Hieno et al.
2017/0162380 A1* 6/2017 Cheng ................. H01L 21/0274

OTHER PUBLICATIONS

Kim et al., "The SMART™ Process for Directed Block Co-Polymer Self-Assembly," Journal of Photopolymer Science and Technology, vol. 26, No. 5, pp. 573-579 (2013).

Liu et al., "Chemical Patterns for Directed Self-Assembly of Lamellae-Forming Block Copolymers with Density Multiplication of Features," Macromolecules, vol. 46, No. 4, pp. 1415-1424 (2013).

Seino et al., "Directed self-assembly lithography using coordinated line epitaxy (COOL) process," Proc. of SPIE. vol. 9423, pp. 942316-1-942316-7 (2015).

Seino et al., "A novel simple sub-15 nm line-and-space patterning process flow using directed self-assembly technology," Microelectronic Eng., vol. 134, pp. 27-32 (2015).

* cited by examiner

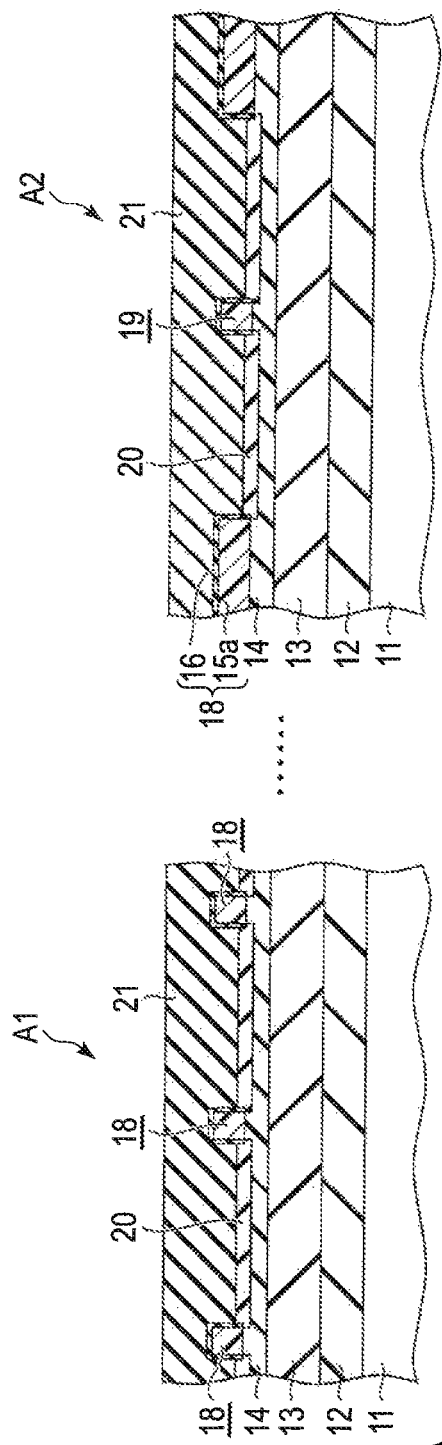
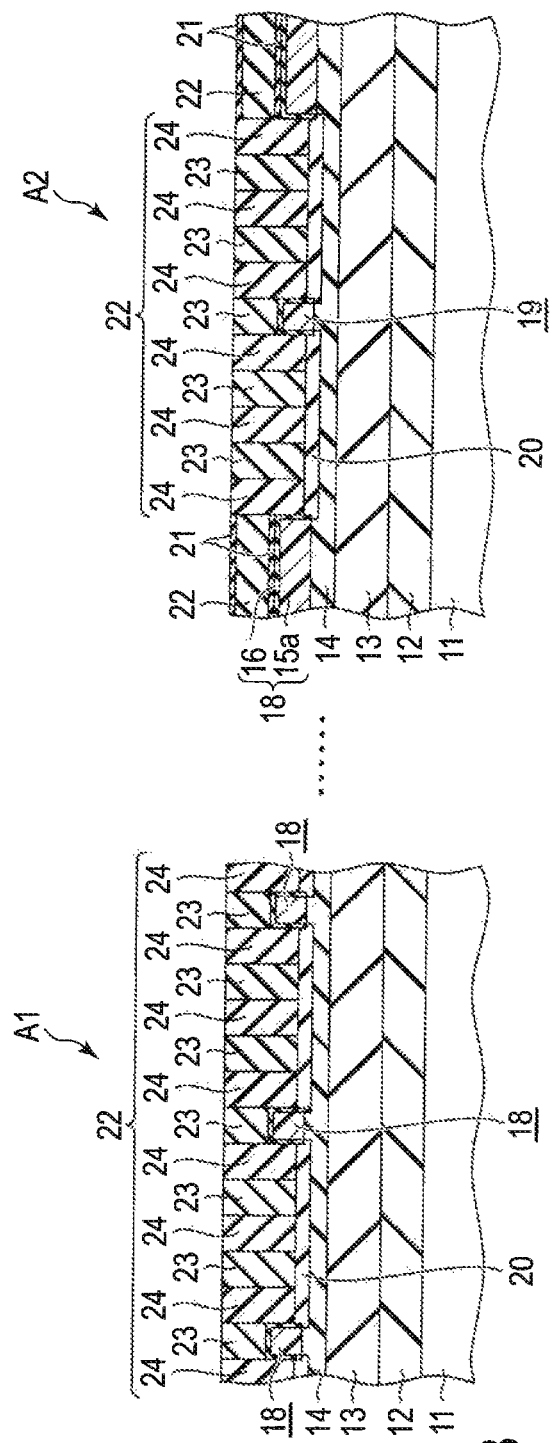
F I G. 2A
F I G. 2B

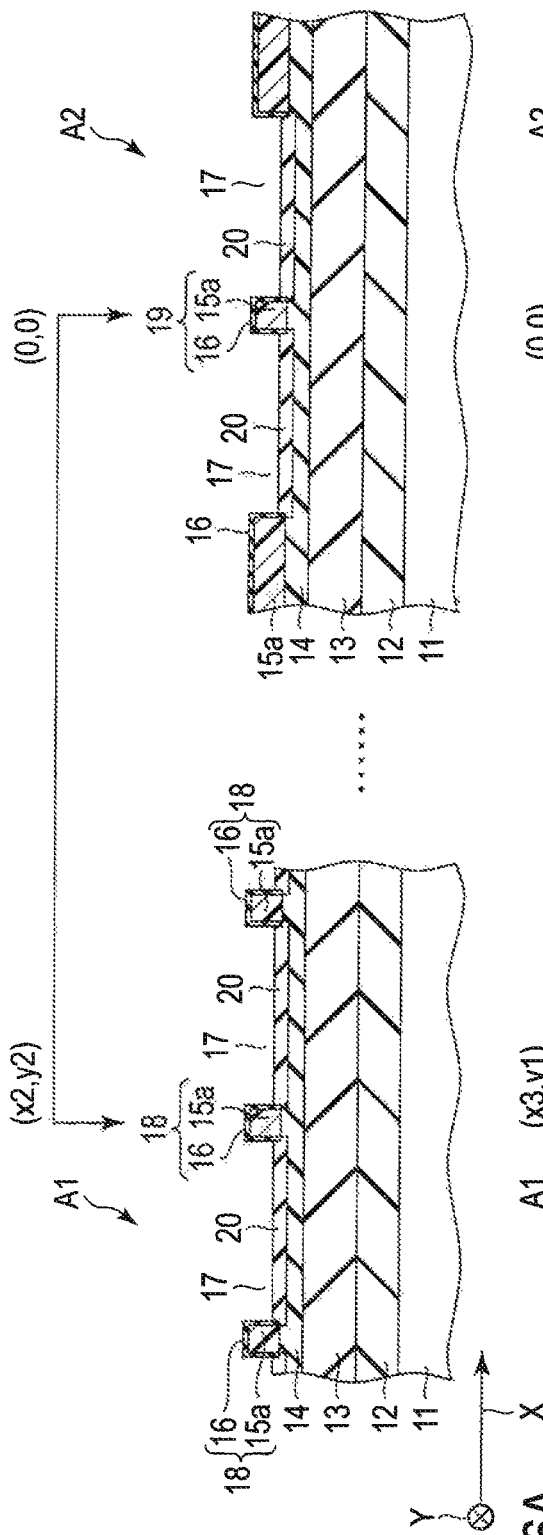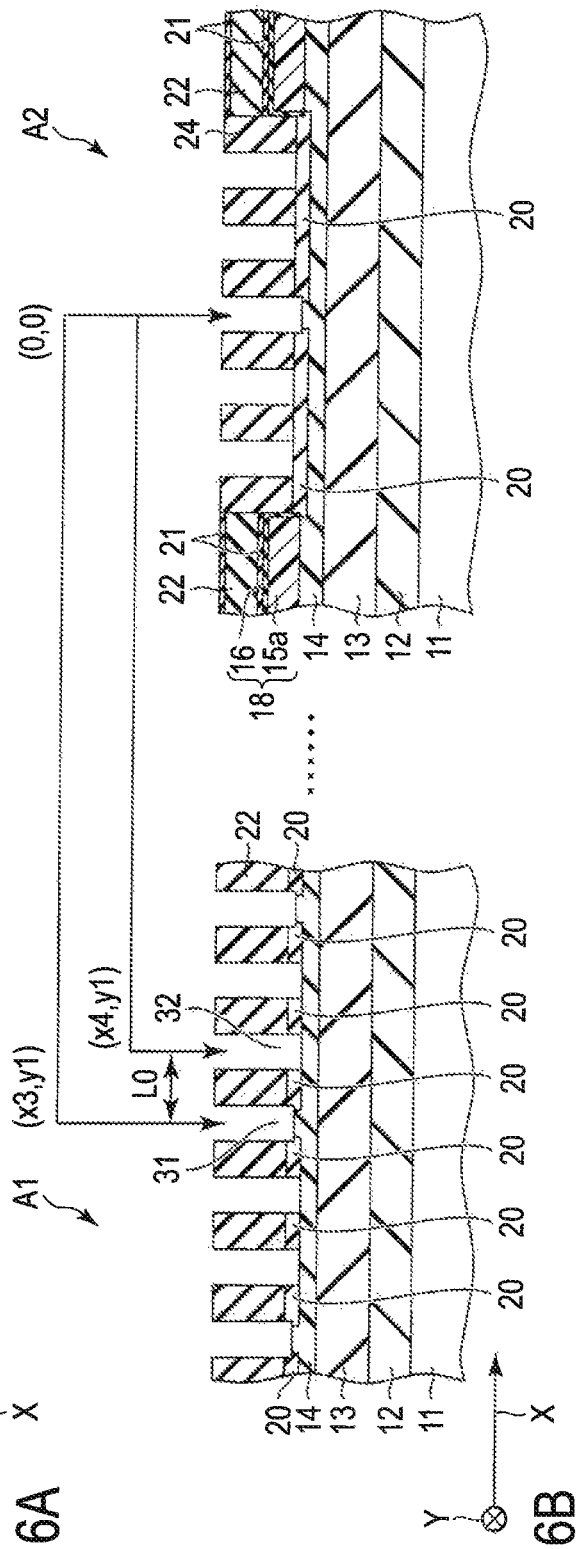
FIG. 6A
FIG. 6B

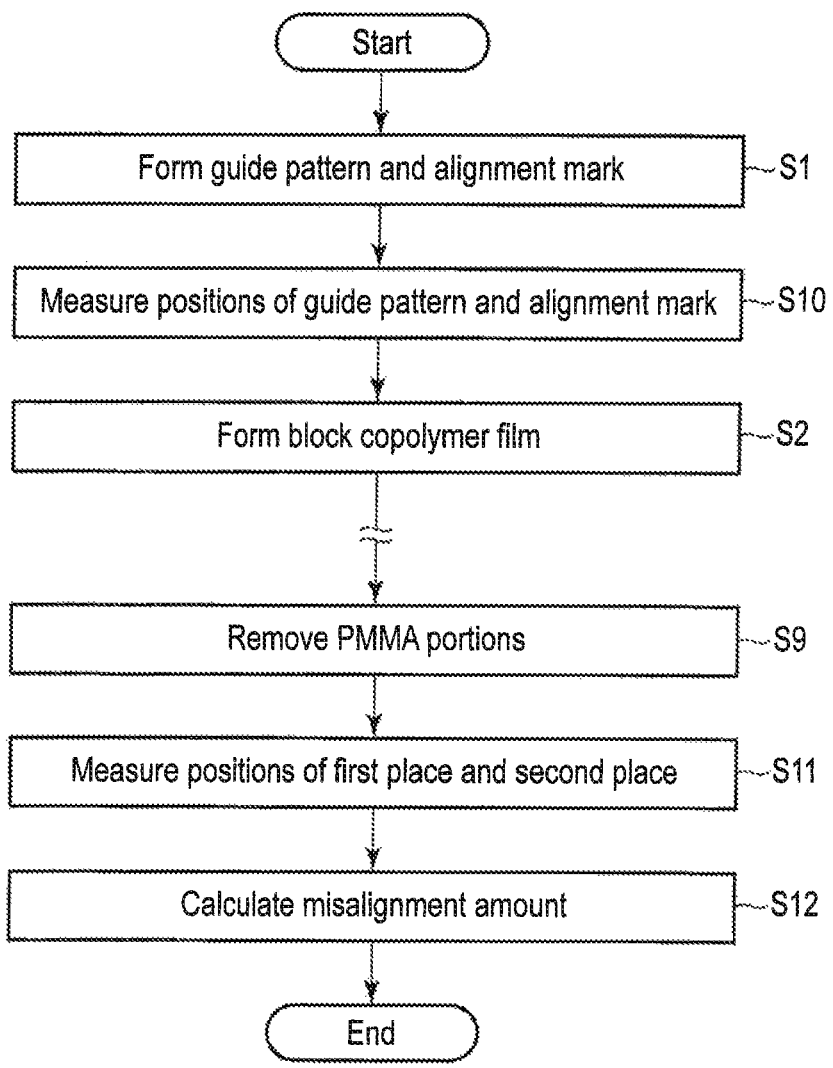
F I G. 7

US 10,950,439 B2

PATTERN FORMING METHOD

CROSS-REFERENCE TO RELATED APPLICATIONS

This application is based upon and claims the benefit of priority from Japanese Patent Application No. 2019-047085, filed Mar. 14, 2019, the entire contents of which are incorporated herein by reference.

FIELD

Embodiments described herein relate generally to a pattern forming method.

BACKGROUND

Pattern forming methods in which directed self-assembly (DSA) techniques are used have been known. The pattern forming methods include, for example, a step of forming a guide pattern on an underlying film, a step of forming a block copolymer film covering the guide pattern and including first and second polymers on the underlying film, a step of subjecting the block copolymer film to microphase separation (heating process) and forming a microphase-separation pattern including first and second portions made of the first and second polymers, and a step of selectively removing part of the microphase-separation pattern.

BRIEF DESCRIPTION OF THE DRAWINGS

FIG. 2A and FIG. 2B are sectional views subsequent to FIG. 1A, FIG. 1B, and FIG. 1C, showing the pattern forming method according to the first embodiment.

FIG. 6A and FIG. 6B are sectional views showing a pattern forming method according to a second embodiment.

FIG. 7 is a flowchart showing the pattern forming method according to the second embodiment.

DETAILED DESCRIPTION

Figure 1A:
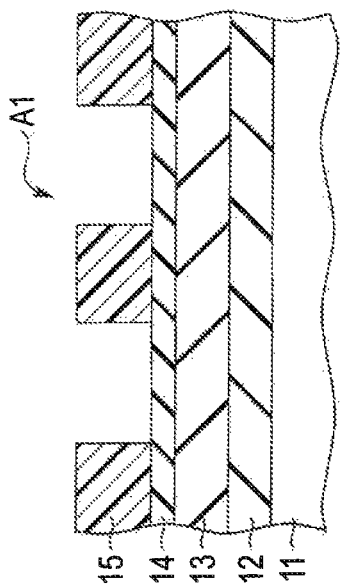
FIG. 1A, FIG. 1B, and FIG. 1C are sectional views showing a pattern forming method according to a first embodiment.
Figure 1A:
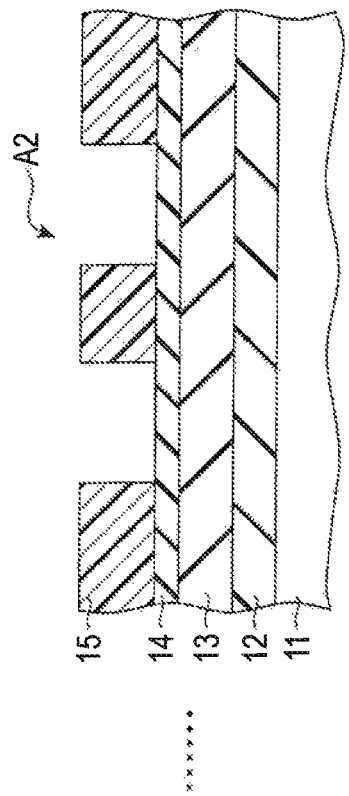

In general, according to one embodiment, a pattern forming method is disclosed. The pattern forming method includes forming a guide pattern on an underlying film. A block copolymer film is formed on the underlying film. The block copolymer film covers the guide pattern and includes a first polymer and a second polymer. A microphase-separation pattern including first portions and second portions is formed by subjecting the block copolymer film to microphase separation. The first portions are made of the first polymer, the second portions are made of the second polymer, and the first portions and the second portions being alternately arranged. A position of the guide pattern is measured by using a scanning probe microscope. A positions of the first portion or the second portion is measured by using a scanning probe microscope. It is determined whether a misalignment amount of the first portions or the second portions with respect to the guide pattern is within a first range, based on the measured position of the first or second portion and the measured position of the guide pattern. The first portions or the second portions are removed when it is determined that the misalignment amount is within the first range.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

First Embodiment

FIG. 1A to FIG. 1C, FIG. 2A, FIG. 2B, FIG. 3A, and FIG. 3B are sectional views showing a pattern forming method according to a first embodiment. FIG. 4 is a flowchart showing the pattern forming method according to the first embodiment. In the present embodiment, a method of forming a line and space pattern will be described.

In each of FIG. 1A to FIG. 1C, FIG. 2A, FIG. 2B, FIG. 3A, and FIG. 3B, the left side shows an area A1 where a pattern (in the present embodiment, a line and space pattern) constituting a semiconductor device is formed, and the right side shows an area A2 where an alignment mark is formed.

In the present embodiment, the line and space pattern is formed by using a coordinated line epitaxy (COOL) process.

First, as shown in FIG. 1A, a film 12 to be processed, a spin-on-carbon (SOC) film 13, a spin-on-glass (SOG) film (underlying film) 14, and a positive type resist pattern 15 are sequentially formed on a substrate 11.

The substrate 11 includes, for example, a silicon substrate (semiconductor substrate), a transistor (semiconductor element) formed on the silicon substrate, and a silicon oxide film (interlayer insulating film) covering the silicon substrate and the transistor. The film 12 to be processed is, for example, a silicon oxide film (insulating film) or a polycrystalline silicon film (semiconductor film).

The positive type resist pattern 15 has a line and space pattern. A method of forming the positive type resist pattern 15 includes, for example, a step of forming a positive photoresist film, a step of subjecting the positive photoresist film to immersion exposure using an ArF excimer laser, and a step of developing the positive photoresist film, which has been subjected to immersion exposure. The SOG film 14 functions as an antireflective film at the time of immersion exposure.

Next, the positive type resist pattern 15 is slimmed by subjecting the positive type resist pattern 15 to reactive ion etching (RIE) using a gas mixture containing oxygen ($O_2$). The SOG film 14 is etched by using the slimmed positive type resist pattern 15 as a mask, and as shown in FIG. 1B, concave portions 17 are formed in the surface of the SOG film 14.

Figure 1B:
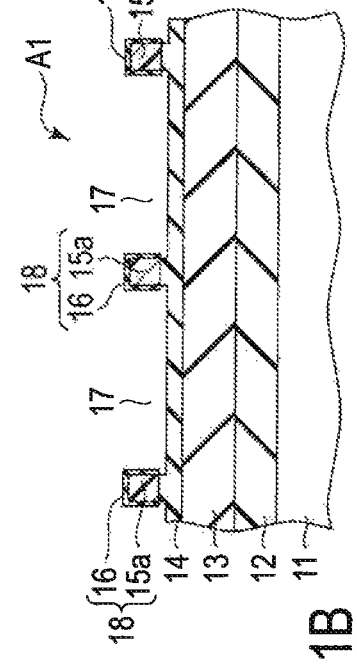
Figure 1B:
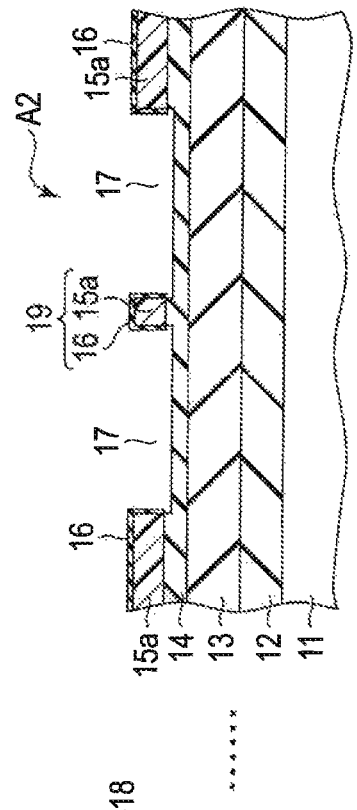

In FIG. 1B, reference symbol 15a represents a positive type resist pattern obtained by slimming the positive type resist pattern 15 shown in FIG. 1A. The positive type resist pattern 15a has a striped pattern having a half pitch size (L0/2) of a desired line and space pattern. The pitch L0 is, for example, 30 nm.

In addition, an oxidized film 16 is formed on surfaces (side surface and top surface) of the positive type resist pattern 15a. This is because the surfaces of the positive type resist pattern 15a are oxidized by performing RIE using a gas mixture containing oxygen ($O_2$). The etching of the SOG film 14 is performed by, for example, RIE using a gas mixture containing CF-based gas.

In this manner, a guide pattern 18 including the positive type resist pattern 15a and the oxidized film 16 is formed in the area A1, and an alignment mark (reference pattern) 19 including the positive type resist pattern 15a and the oxidized film 16 is formed in the area A2 (step S1).

The oxidized film 16 has an affinity for a hydrophilic polymer block such as polymethyl methacrylate (PMMA). Thus, the guide pattern 18 and the reference pattern 19 can be used as chemical guide patterns. The guide pattern 18 and the reference pattern 19 form convex steps. Thus, the guide pattern 18 and the reference pattern 19 function as physical guides.

Figure 1C:
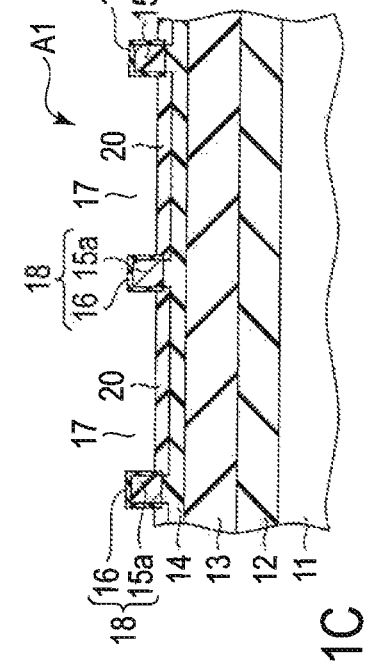
Figure 1C:
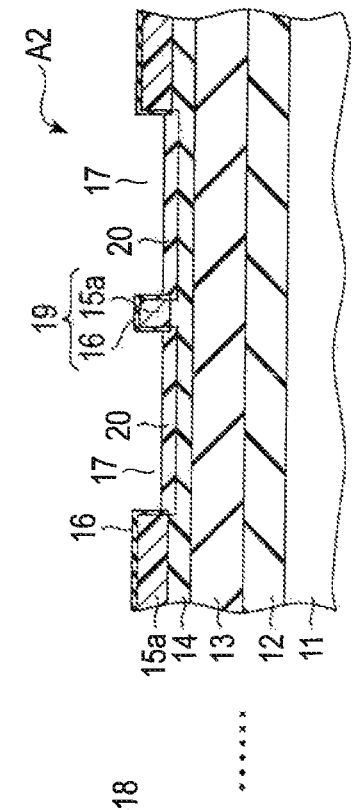

Next, as shown in FIG. 1C, a neutral film 20 is formed in the concave portions 17. In the present embodiment, the neutral film 20 includes a random copolymer (PS-r-PMMA) of a hydrophobic polymer block such as polystyrene (PS) and a hydrophilic polymer block such as PMMA. Thus, the neutral film 20 has an affinity for the hydrophobic polymer block and the hydrophilic polymer block.

A method of forming the neutral film 20 includes, for example, a step of forming a PS-r-PMMA coating film on the SOG film 14 in the concave portions 17, a step of forming the neutral film 20 by heating the PS-r-PMMA coating film and the SOG film 14 and making the lower part of the PS-r-PMMA coating film and the upper part of the SOG film 14 react with each other, and a step of removing an unreacted PS-r-PMMA film.

Next, as shown in FIG. 2A, a block copolymer film 21 covering the guide pattern 18 and the neutral film 20 and including PMMA (first polymer) and PS (second polymer) is formed (step S2). For example, the block copolymer film 21 covering the guide pattern 18 and the neutral film 20 is formed by applying a solution including polystyrene-b-poly (methyl methacrylate) (PS-b-PMMA), which is a block copolymer, to the tops of the guide pattern 18 and the neutral film 20.

Next, the block copolymer film 21 is subjected to microphase separation by using an annealing process (heating process) at approximately 250° C. to 300° C., and then, PMMA segregates on the guide pattern 18. Thus, as shown in FIG. 2B, a microphase-separation pattern 22 is formed on the guide pattern 18 and the neutral film 20 (step S3). The guide pattern 18 and the neutral film 20 are covered by the microphase-separation pattern 22.

The microphase-separation pattern includes 22 PMMA portions (first portions) 23 made of PMMA (first polymer), PS portions (second portions) 24 made of PS (second polymer), and a regular arrangement structure in which the PMMA portions 23 and the PS portions 24 are alternately arranged. In the case of the present embodiment, one of the PMMA portions 23 is disposed on the guide pattern 18, and another one of the PMMA portions 23 is disposed on the alignment mark 19.

Figures 3A, 3B:
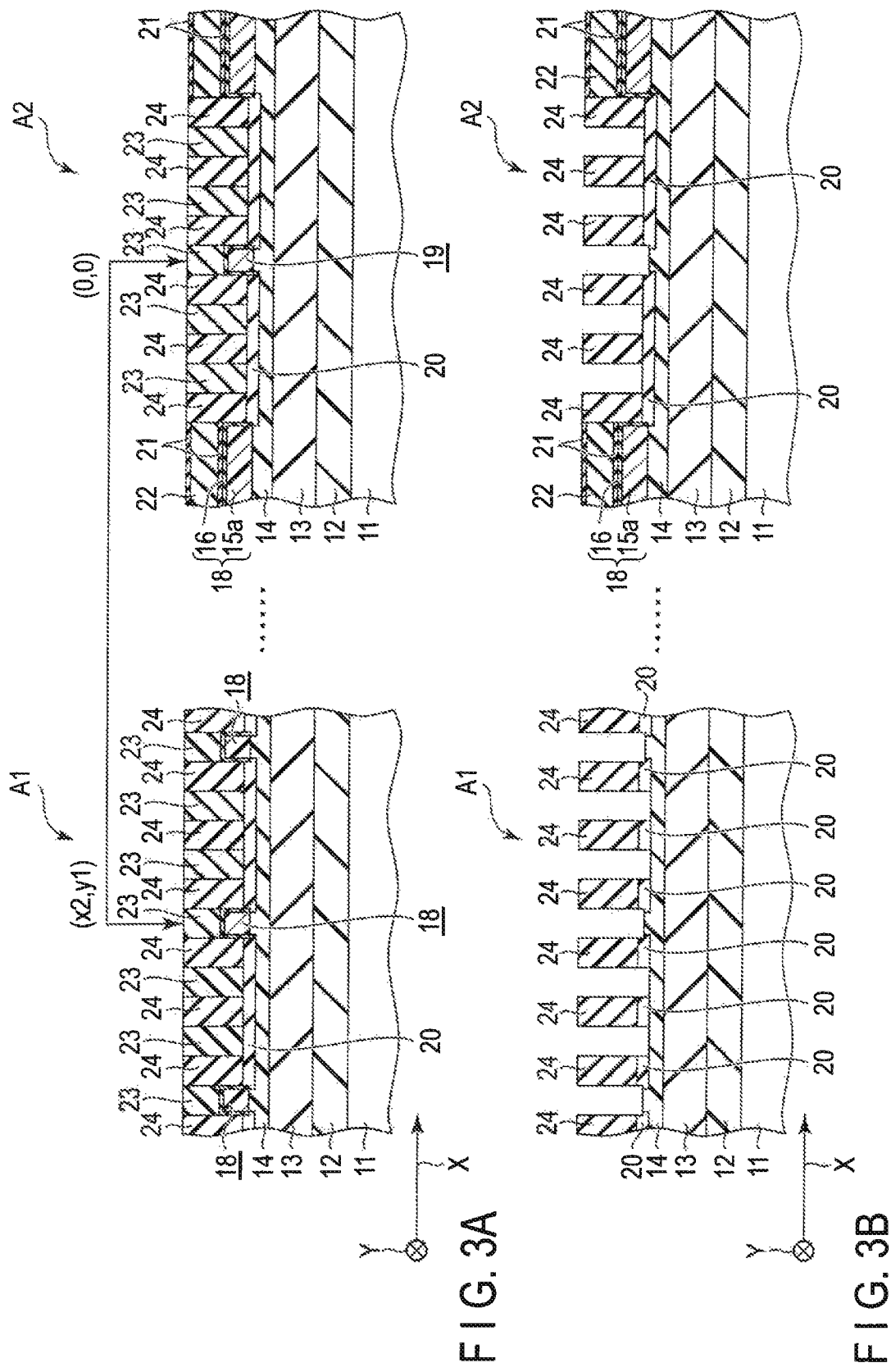
FIG. 3A and FIG. 3B are sectional views subsequent to FIG. 2A and FIG. 2B, showing the pattern forming method according to the first embodiment.
Figure 4:
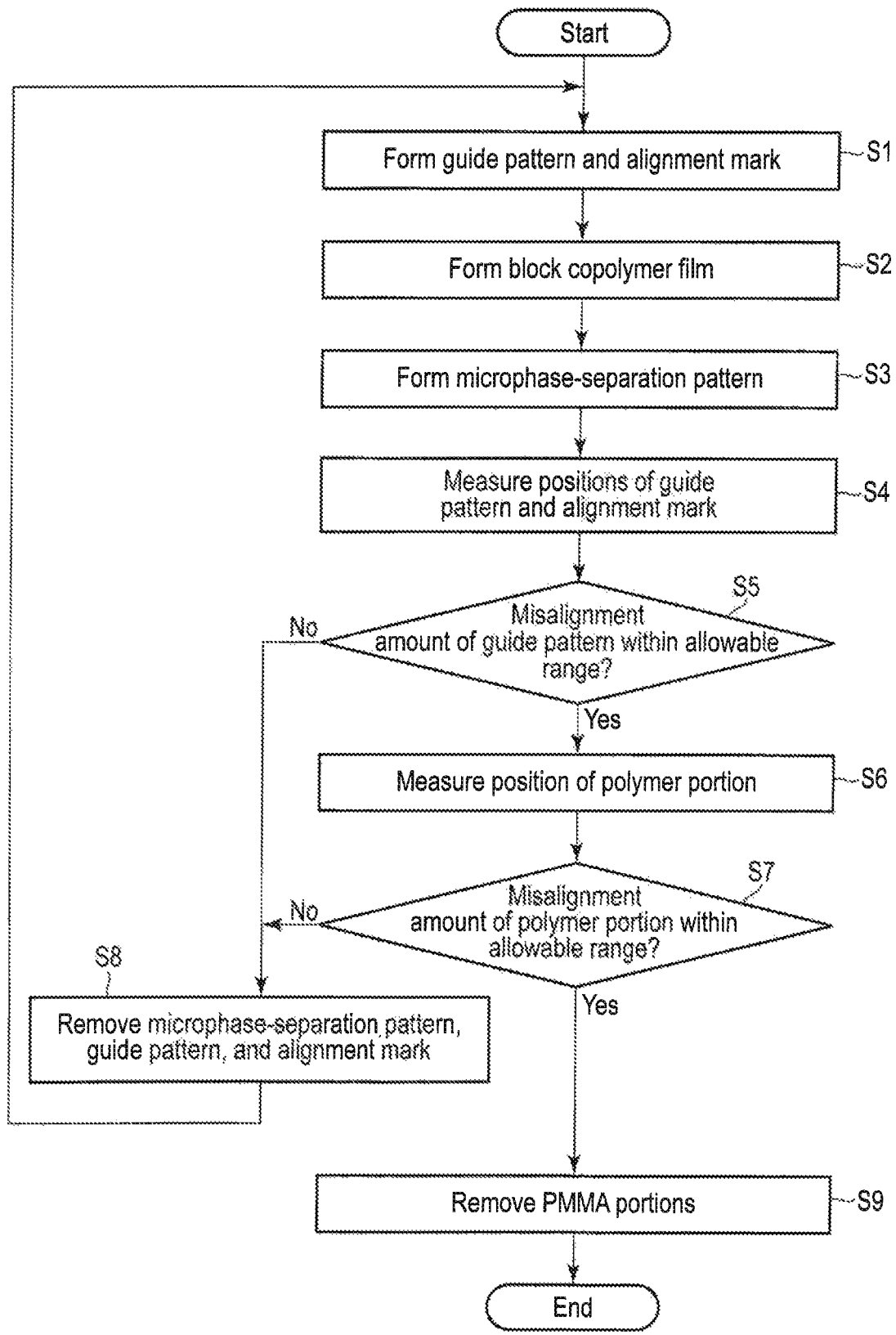
FIG. 4 is a flowchart showing the pattern forming method according to the first embodiment.

Next, the positions of the guide pattern 18 and the alignment mark 19 are measured by using an atomic force microscope (AFM) as shown in FIG. 3A (step S4). For example, the position or positions of one or more places of the guide pattern 18 are measured, and the position or positions of the one or more places are determined as the position of the guide pattern 18. Similarly, the position or positions of one or more points of the alignment mark 19 are measured, and the position or positions of the one or more places are determined as the position of the alignment mark 19.

Note that, FIG. 3A shows a case where the position of one place of the central guide pattern 18 and the position of one place of the alignment mark 19 are measured.

In the present embodiment, the measured positions are represented by coordinate positions (value of an X-axis, value of an Y-axis) of an XY rectangular coordinate system defined by the X-axis and the Y-axis shown in FIG. 3A. The Y-axis is perpendicular to the plane of paper. The PMMA portions 23 and the PS portions 24 are alternately arranged along the X-axis. Long sides of the PMMA portions 23 and the PS portions 24 are parallel to the Y-axis.

In the present embodiment, the coordinate position of the alignment mark 19 in step S4 is the origin (0, 0), and the coordinate position of the guide pattern 18 is (x2, y1).

Here, in the step of position measurement of FIG. 3A (step S4), the guide pattern 18 and the alignment mark 19 are covered by the microphase-separation pattern 22. It is therefore hard to detect the positions of the guide pattern 18 and the alignment mark 19 by using a well-known displacement inspection device, such as an optical displacement inspection device or an electron-beam displacement inspection device.

Figure 10:
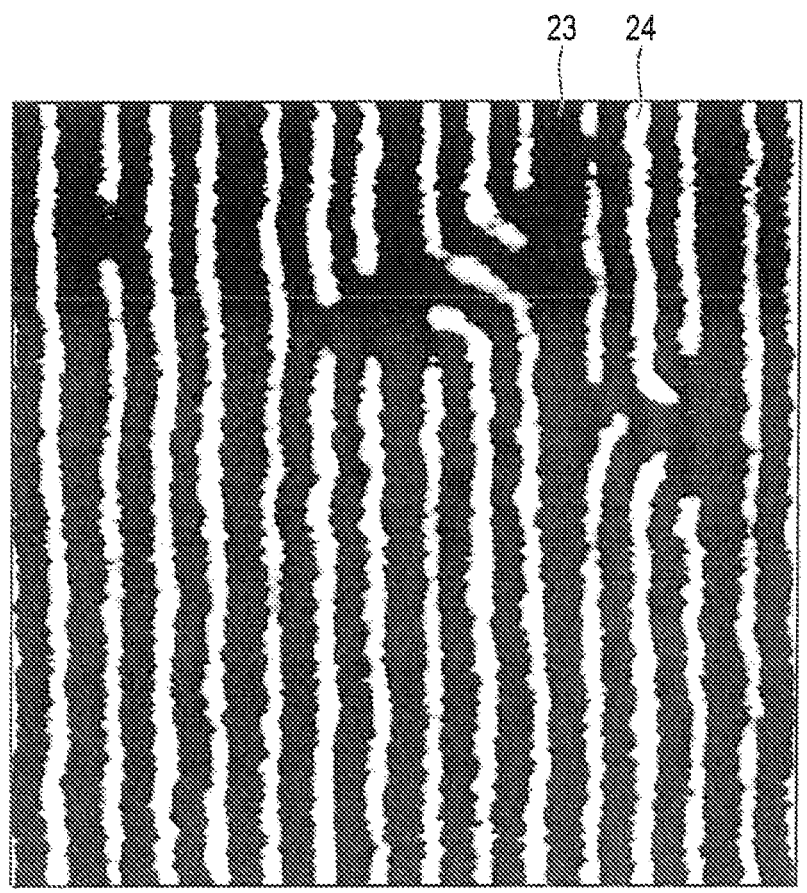
FIG. 10 is a diagram showing an image of hydrophilic polymer blocks and hydrophobic polymer blocks obtained by using a plane tapping mode of the atomic force microscope.

FIG. 10 is a diagram showing an image of the PMMA portions 23 (hydrophilic polymer blocks) and the PS portions 24 (hydrophobic polymer blocks) in the COOL process (Y. Seino et al., 40th Micro and Nano Engineering, B2L-A, 8076 (2014); Y. Seino et al., Proc. SPIE, 9423, 9423(2015); T. Azuma et al., J. Vac. Sci. Technol., B33, 06F302 (2015)) obtained by using a plane tapping mode of the AFM.

From FIG. 10, it is understood that when the plane tapping mode of the AFM is used, the PS portions 24 (white portions) and the PMMA portions 23 (black portions), which are hard to distinguish by an optical inspection method or an electron-beam inspection method, are distinguishable in high contrast.

Thus, in step S4, the positions of the alignment mark 19 and the guide pattern 18 are measured by using the AFM as described above.

Note that, it is confirmed that it is hard to distinguish the PS portions 24 and the PMMA portions 23 in high contrast by using a scanning transmission electron microscope (STEM). This seems to be because the elementary compositions of the PS portions 24 and the PMMA portions 23 are similar to each other.

Note that, in general, to form a perpendicular lamellar pattern, it is necessary to perform a heating process for promoting self-assembly of a block copolymer having an appropriate film thickness on a neutral film. How the temperature dependence of the directed self-assembly of the block copolymer varies according to the presence or absence of a chemical guide pattern was examined by using the plane tapping mode of the AFM.

As a result, it was confirmed that when there was no chemical guide pattern, the block copolymer underwent a phase separation in cases where the temperature of the heating process was 70° C., 170° C., 180° C., and 200° C., but a fingerprint pattern in which the positions of hydrophilic polymer blocks and hydrophobic polymer blocks were indefinite was formed.

In contrast, it was confirmed that when there was a chemical guide pattern, the position of the chemical guide pattern buried under polymer blocks (hydrophilic polymer blocks and hydrophobic polymer blocks) could be detected with high accuracy in cases where the temperature of the heating process was 70° C., 170° C., 180° C., and 200° C. Moreover, it was also confirmed that a boundary region between the hydrophobic polymer blocks and the hydrophilic polymer blocks after phase separation could be detected with high accuracy.

Figure 5:
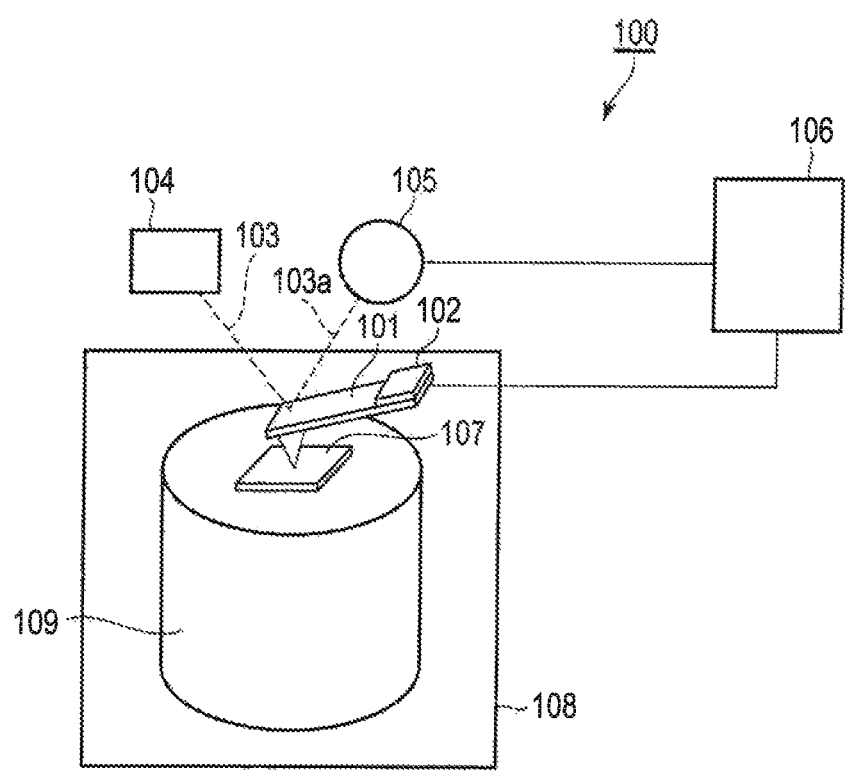
FIG. 5 is a diagram schematically showing an atomic force microscope.

FIG. 5 is a diagram schematically showing an AFM 100.

The AFM 100 includes a cantilever 101, an oscillator 102 which oscillates the cantilever 101 up and down at a predetermined frequency of oscillations, a laser beam source 104 which radiates a laser beam 103 to the cantilever 101, a receiving unit 105 which receives a laser beam 103a reflected by the cantilever 101, a computer 106 for analysis and control, which is connected to the oscillator 102 and the receiving unit 105, a chamber 108 which accommodates a sample (wafer including a pattern formed by the method of the embodiment) 107, and a scanner 109 which supports the sample 107 and brings the sample 107 closer to the cantilever 101 in the chamber 108.

In the present embodiment, the positions of the alignment mark 19 and the guide pattern 18 are measured by operating the AFM 100 in the tapping mode. In the tapping mode, the surface shape of the sample 107 is measured at high speed such that the sample 107 is to be a non-destructive state wherever possible. Moreover, in the tapping mode, the oscillation amplitude of the cantilever 101 changes according to the nanolevel surface shape of the sample 107, the nanolevel internal, structure of the sample 107 (for example, the nanolevel internal structure in a polymer thin film), etc. Thus, an image of the nanolevel internal structure of the sample 107 can be obtained at high speed and with high accuracy by monitoring changes (phase difference) in the oscillation amplitude and performing the z feedback loop in a closed loop to minimize the changes.

In the present embodiment, on the basis of the position of the guide pattern 18 and the position of the alignment mark 19 measured by using the AFM 100, it is determined whether the misalignment amount of the guide pattern 18 with respect to the alignment mark 19 is within an allowable range (second range) (step S5).

For example, given that the coordinate position of the guide pattern 18 measured in step S5 is (x2, y1) and the coordinate position of the alignment mark 19 measured in step S5 is (0, 0), it is determined that the misalignment amount of the guide pattern 18 with respect to the alignment mark 19 is within the allowable range, when the absolute value of x2 is a predetermined value or less.

When it is determined that the misalignment amount of the guide pattern 18 with respect to the alignment mark 19 is within the allowable range in step S5, the position of the PMMA portion (positions of polymer portion) are measured (step S6). Here, the case where the position of the PMMA portion 23 is measured will be described. The measurement of step S6 is carried out by using the AFM. This is because when the AFM is used, the PS portions and the PMMA portions can be distinguished in high contrast as described above.

Next, on the basis of the position of the PMMA portion 23 measured in step S6 and the position of the guide pattern 18 measured in step S4, it is determined whether the misalignment amount of the PMMA portions 23 with respect to the guide pattern 18 is within an allowable range (first range) (step S7). The first range may be same as the second range. Alternatively, the first range may be different from the second range.

When it is determined that the misalignment amount of the PMMA portions 23 with respect to the guide pattern 18 is within the allowable range in step S7, the PMMA portions 23 are selectively removed (step S9), and the PS portions 24 are left as shown in FIG. 3B.

More specifically, the PMMA portions 23 are selectively removed by RIE using a gas mixture containing oxygen ($O_2$). At this time, the guide pattern 18 and the alignment mark 19 under the PMMA portions 23 are also removed. At a result, a mask pattern in the form of a line and space pattern constituted of the PS portions 24 having a half pitch (L0/2, for example, 15 nm) is obtained.

In contrast, when it is determined that the misalignment amount is out of the allowable range in step S5 or step S7, the microphase-separation pattern 22, the guide pattern 18, and the alignment mark 19 are removed (step S8), thereafter, steps S1 to S3 are carried out again, thereby forming the guide pattern 18, the alignment mark 19, and the microphase-separation pattern 22 again.

Next, steps S4 and 35 are carried out again for the guide pattern 18, the alignment mark 19, and the microphase-separation pattern 22, which have been formed again. Here, when it is determined that the misalignment amount is not within the allowable range in step S5, a series of steps S8, S1, S2, S3, S4, and S5 is performed again. When it Is determined that the misalignment amount is not within the allowable range in step S5 even though the series of steps is performed a predetermined number of times, the flow proceeds to the end.

In addition, when it is determined that the misalignment amount is not within the allowable range in step S7, a series of steps S8, S1, S2, S3, S4, Sa, S6, and S7 is performed again. When it is determined that the misalignment amount is not within the allowable range in step S7 even though the series of steps is performed a predetermined number of times, the flow proceeds to the end.

Note that, when the series of steps S8, S1, S2, S3, S4, and S5 is repeated a number of times N (natural number) and in the N-th time of step S5, it is determined that the misalignment amount is not within the allowable range, the flow may proceed to step S6. That is, the flow proceeds to step S6, when it is known in advance that there is high possibility that the misalignment amount falls in the allowable range by repeating the re-forming of the guide pattern, the alignment mark and the microphase-separation pattern a predetermined number of times (more than once) This can reduce the manufacturing cost and shorten the manufacturing period. Similarly, when the series of steps S8, S1, S2, S3, S4, S5, S6, and S7 is repeated a number of times M (natural number) and in the M-th time of step S7, it is determined that the misalignment amount is not within the allowable range, the flow may proceed to step S9.

Figure 11A:
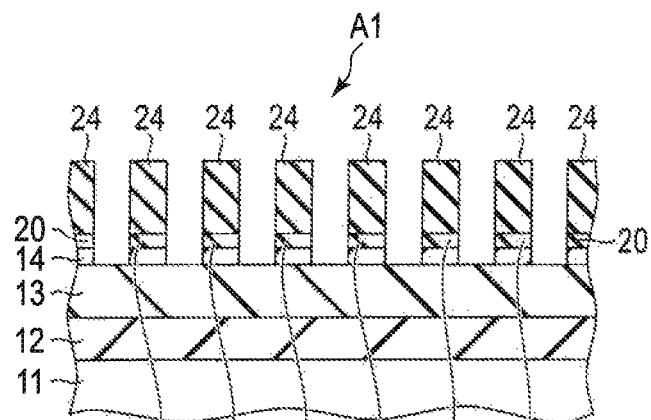
FIG. 11A, FIG. 11B, and FIG. 11C are sectional views showing a pattern forming method in which a DSA pattern is used.
Figure 11B:
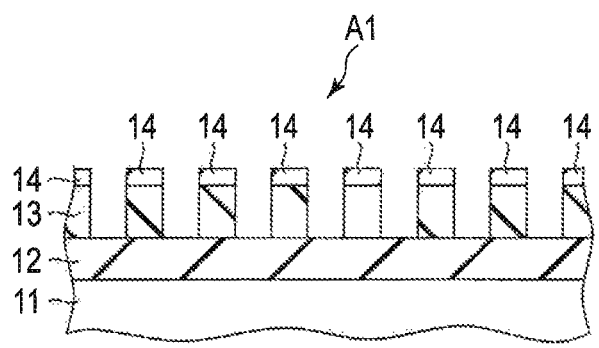
Figure 11C:
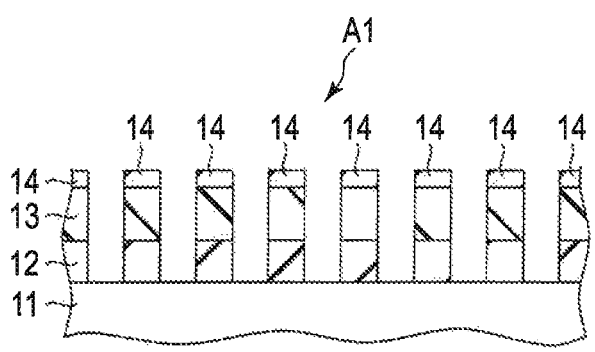

Thereafter, the processes shown in FIG. 11A to FIG. 11C are performed in the area A1 where the pattern constituting the semiconductor device is formed.

First, the SOG film (underlying film) 14 and the neutral film 20 are etched by using the PS portions 24 as a mask, and a pattern (DSA pattern) of the PS portions 24 is transferred to the SOG film 14 (FIG. 11A). Next, the SOC film 13 is etched by using the PS portions 24 and the SOG film 14 as a mask, and a pattern of the SOG film 14 is transferred to the SOC film 13 (FIG. 11B). Hereinafter, the description is given for a case where the PS portions 24 and the neutral film 20 disappear while the SOC film 13 is being etched. After that, a line and space pattern (L/S pattern) is obtained by etching the processed film 12 by using the SOG film 14 and the SOC film 13 as a mask (FIG. 11C). When the film 12 is an insulating film, grooves of the line and space pattern are obtained, and when the film 12 is a polycrystalline silicon film, interconnections of the line and space pattern are obtained.

Note that, the similar processes shown in FIG. 11A to FIG. 11C are performed in the area A2 where the alignment mark is formed, description of which is omitted for the sake of simplification.

Second Embodiment

FIG. 6A and FIG. 6B are sectional views showing a pattern forming method according to a second embodiment. FIG. 7 is a flowchart showing the pattern forming method according to the second embodiment. In the present embodiment, a method of forming a line and space pattern will be described.

In the present embodiment, the positions of a guide pattern 18 and an alignment mark 19 are measured as shown in FIG. 6A, between the step of FIG. 1C and the step of FIG. 2A of the first embodiment (step S10). That is, in step S10, the position of the guide pattern formed in step S1 and the position of the alignment mark formed in step S1 are measured.

In the step of position measurement of FIG. 6A, since the guide pattern 18 and the alignment mark 19 are exposed, the positions of the guide pattern 18 and the alignment mark 19 can be measured by using a well-known optical displacement inspection device or electron-beam displacement inspection device. The positions of the alignment mark 19 and the guide pattern 18 may be measured by operating an AFM 300 in a tapping mode.

In the present embodiment, description is given by letting the alignment mark 19 measured in step S10 be the origin (0, 0). In addition, let the coordinate position of the guide pattern 18 measured in step S10 be (x1, y1).

Next, when the flow reaches step S9 in the pattern forming method of the first embodiment, the position of a place (first place) 31 where the guide pattern is removed and a place (second place) 32 located away from the point 31 at an integral multiple (1 in FIG. 6B) of a first pitch along an X-axis are measured as shown in FIG. 6B (step S11).

In the present embodiment, the first pitch is L0 (pitch of PMMA portions along the X-axis). The position of the first place 31 and the position of the second place 32 are determined by using the position of a place where the alignment mark is removed as the origin.

Since the first place 31 and the second place 32 are exposed, the position of the first place 31 and the position of the second place 32 can be measured by using an optical displacement inspection device or an electron-beam displacement inspection device. Further, the positions may be measured by using the AFM.

In the present embodiment, let the coordinate position of the first place 31 in step S11 and the coordinate position of the second place 32 be (x3, y1) and (X4, y1), respectively.

Next, the misalignment amount of a mask pattern (PS portions 24) along the X-axis is calculated on the basis of the coordinate position (x1, y1), the coordinate position (x2, y1), the coordinate position (x3, y1), and the coordinate position (x4, y1) (step S12).

More specifically, let x1+(x1−x2)+(x1−x3)−n (n is one in the present embodiment)·L0, and a difference Δx between x4' and x4 is calculated. Since the difference Δx is calculated in consideration of the misalignment amount in each of steps S1, S3, and S9, and thus the misalignment amount of the mask pattern can be accurately calculated.

Note that, in the present embodiment, the line and space pattern disposed along the X-axis is formed, but when a pattern in which the PMMA portions are also repeatedly arranged along a Y-axis with a second pitch is formed, the measurement in step S4 and the measurement in step S11 are also carried out along the Y-axis. The first pitch and the second pitch may be the same or different.

In this case, let the second pitch be L2, let the coordinate position of the guide pattern measured in step S4 be (x1, y2), let the coordinate position of the first place measured in step S11 be (x1, y3), and let the coordinate position of the second place measured in step S11 be (x1, y4), and let y1+(y1−y2)+(y1−y3)−m·L2 (m is an integer) be y4', a difference by (for example, y4'−y4 or y4−y4') is calculated in step S12.

In the present embodiment, a patterning method of using the AFM in step S4 and using the optical displacement inspection device in steps S10 and S11 is the closest to a misalignment amount inspection method in a lithographic step in the current semiconductor manufacturing.

In addition, a patterning method of using the AFM in step S4 and using the electron-beam displacement inspection device in steps S10 and S11 is effective in forming a nanolevel minute pattern.

It is also possible to use the AFM in step S4 and use different types of inspection device in steps S10 and S11, respectively.

Moreover, a method using the AFM (tapping mode) in steps S4, S10, and S11 can carry out the most accurate measurement since the method does not depend on differential measurement.

In the present embodiment, when the measurement is carried out at high speed, the AFM is used only in step S4.

While the PMMA portions are removed in the above-described embodiments, the PS portions may be removed. In addition, the PMMA portions are formed on the guide pattern, the PS portions may be formed on the guide pattern.

Moreover, the above-described embodiments are applicable to cases where a LiNe Process or a SMART Process (registered trademark) (J. Kim et al., J. Photopolym. Sci. Technol., 26(5), 573(2013)) is used.

Figure 8A:
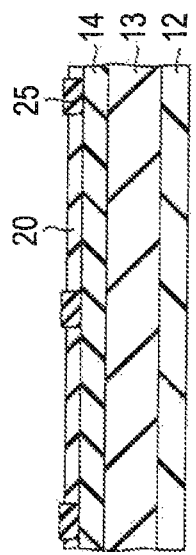
FIG. 8A, FIG. 8B, FIG. 8C, FIG. 8D, FIG. 8E, and FIG. 8F are sectional views showing a LiNe Process.
Figure 8B:
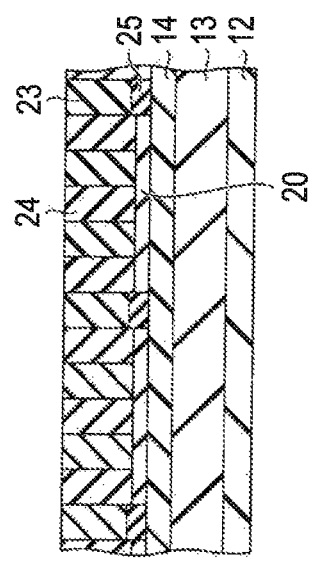
Figure 8C:
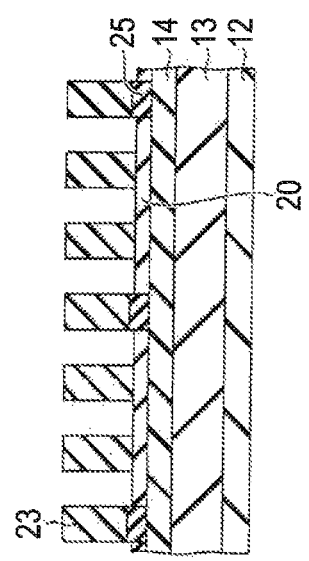
Figure 8D:
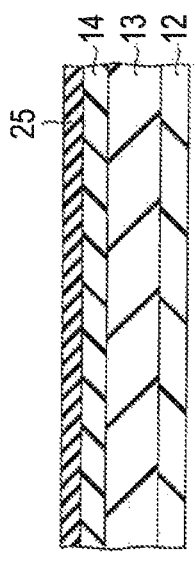
Figure 8E:
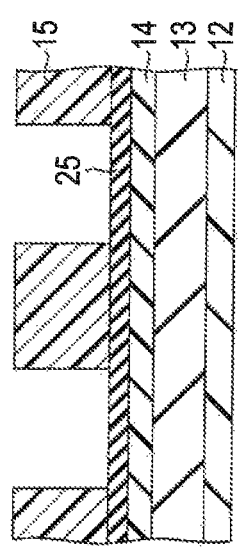
Figure 8F:
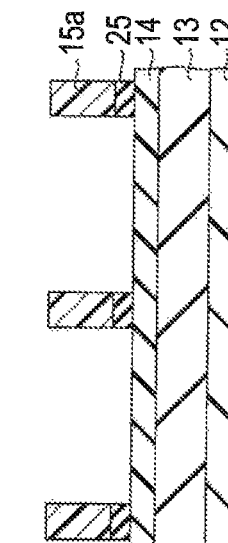

FIG. 8A to FIG. 8F show a process chart of the LiNe Process. In FIG. 8A to FIG. 8F, reference symbol 25 represents a cross-linked PS (polystyrene) film. In the LiNe Process, the cross-linked PS film 25 formed in the step of FIG. 8D is used as a guide pattern (chemical guide). FIG. 8D, FIG. BE, and FIG. 8F of the LiNe Process correspond to FIG. 1C, FIG. 2B, and FIG. 3B of the embodiments, respectively.

Figure 9A:
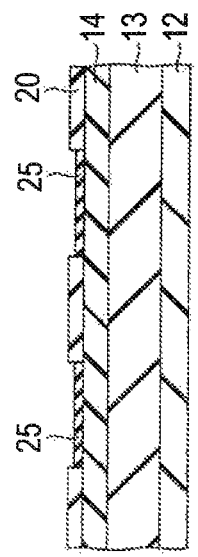
FIG. 9A, FIG. 9B, FIG. 9C, FIG. 9D, FIG. 9E, and FIG. 9F are sectional views showing a SMART Process.
Figure 9B:
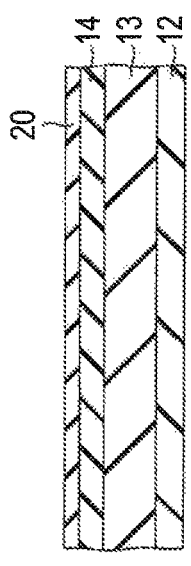
Figure 9C:
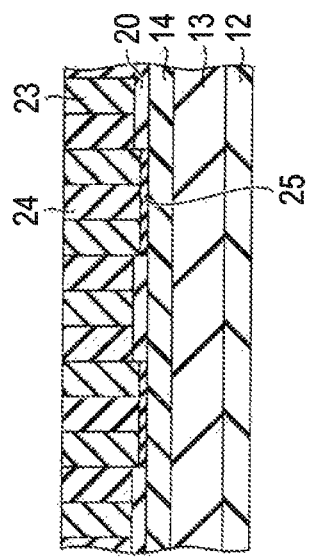
Figure 9D:
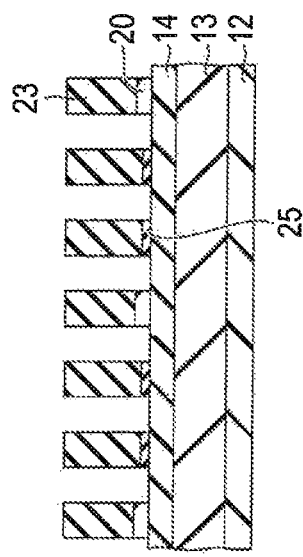

FIG. 9A to FIG. 9F show a process chart of the SMART Process. In FIG. 9A to FIG. 9F, reference symbol 15N represents a negative type resist pattern. In the SMART Process, the cross-linked PS film 25 formed in the step of FIG. 9D is used as a guide pattern (chemical guide). FIG.

Figure 9E:
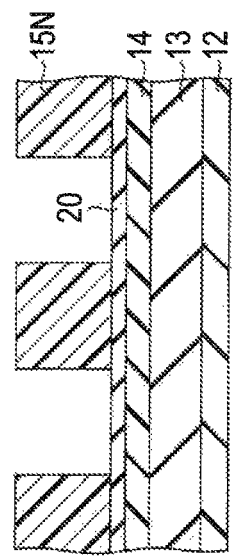
Figure 9F:
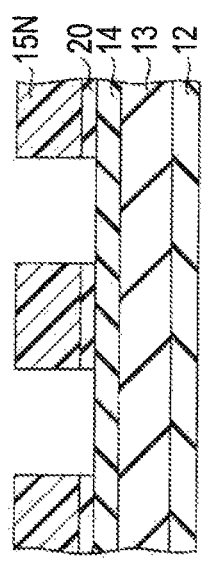

9D, FIG. 9E, and FIG. 9F of the SMART Process correspond to FIG. 1C, FIG. 2B, and FIG. 3B of the embodiments, respectively.

Furthermore, the AFM is used as a scanning probe microscope in the above-described embodiments, a scanning tunneling microscope (STM), a friction force microscope (FFM), a magnetic force microscope (MFM), a scanning Maxwell-stress microscope (SMM), a kelvin probe force microscope surface potential (KFM), or a scanning near-field optical microscope (SNOM) may be used.

In the pattern forming method of the first and second embodiments, the neutral film is used, but the neutral film may be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming a guide pattern on an underlying film;
    forming a block copolymer film covering the guide pattern on the underlying film, the block copolymer film including a first polymer and a second polymer;
    forming a microphase-separation pattern including first portions made of the first polymer and second portions made of the second polymer by subjecting the block copolymer film to microphase separation, the first portions and the second portions being alternately arranged;
    measuring a position of the guide pattern by using a scanning probe microscope;
    measuring a position of at least one of the first portions or at least one of the second portions by using a scanning probe microscope;
    determining whether a misalignment amount of the first portions or the second portions with respect to the guide pattern is within a first range, based on the measured position of the at least one of the first portions or at least one of the second portions and the measured position of the guide pattern; and
    removing the first portions or the second portions, when it is determined that the misalignment amount is within the first range.

2. The pattern forming method of claim 1, wherein the position of the at least one of the portions or at least one of the second portions is measured by operating the scanning probe microscope in a tapping mode.

3. The pattern forming method of claim 1, wherein the scanning probe microscope includes an atomic force microscope.

4. The pattern forming method of claim 1, wherein the position of the guide pattern is measured based on a position of a reference pattern formed on the underlying film.

5. The pattern forming method of claim 4, wherein:
    one of the first portions is disposed on the guide pattern and another one of the first portions is disposed on the reference pattern, when the microphase-separation pattern is formed; and
    a mask pattern comprising the second portions is formed by removing the first portions and the guide pattern, when the misalignment amount is within the first range.

6. The pattern forming method of claim 5, further comprising:
    measuring the position of the guide pattern formed on the underlying film before forming the block copolymer film on the guide pattern; and
    measuring a position of a first place where the guide pattern and the first portion thereon are removed and a position of a second place located at a predetermined distance from the position of the first place of the mask pattern.

7. The pattern forming method of claim 6, further comprising calculating a misalignment amount of the mask pattern after measuring the position of the first place and the position of the second place.

8. The pattern forming method of claim 7,
    wherein:
    a coordinate position (value of an X-axis, value of a Y-axis) of an XY coordinate system defined by the X-axis and the Y-axis intersecting the X-axis is used;
    the second portions are arranged along the X-axis with a first pitch;
    let the first pitch be L1;
    let the coordinate position of the reference pattern be (0, 0);
    let the coordinate position of the guide pattern measured by using the scanning probe microscope be (x2, y1);
    let the coordinate position of the guide pattern measured before forming the block copolymer film be (x1, y1);
    let the coordinate position of the measured first place be (x3, y1);
    let the coordinate position of the measured second place be (x4, y1);
    let x4' be x1+(x1−x2)+(x1−x3)−n·L1, where n is integer; and
    a difference between the x4 and the x4' is calculated when the misalignment amount of the position of the mask pattern is calculated.

9. The pattern forming method of claim 8, wherein: the second portions are arranged along the Y-axis with a second pitch L2; let the coordinate position of the guide pattern measured by using the scanning probe microscope be (x1, y2); let the coordinate position of the measured first place be (x1, y3); let the coordinate position of the measured second place be (x1, y4); let the y4' is y1+(y1−y2)+(y1−y3)−mL2, and m is integer; and a difference between the y4 and the y4' is calculated when the misalignment amount of the position of the mask pattern is calculated.

10. The pattern forming method of claim 6, wherein the measuring the position of the guide pattern formed on the underlying film before forming the block copolymer film on the guide pattern, the measuring the position of the first place and the measuring the position of second place are each performed by using an optical displacement inspection device, an electron-beam displacement inspection device, or the scanning probe microscope.

11. The pattern forming method of claim 1, further comprising determining whether a misalignment amount of the guide pattern is within a second range after measuring the position of the guide pattern by using the scanning probe microscope and before measuring the position of the at least one of the portions or at least one of the second portions by using the scanning probe microscope.

12. The pattern forming method of claim 11, further comprising removing the microphase-separation pattern and the guide pattern, when it is determined that the misalignment amount of the guide pattern is out of the second range.

13. The pattern forming method of claim 1, further comprising removing the microphase-separation pattern and the guide pattern, when it is determined that the misalignment amount of the first portions or the second portions with respect to the guide pattern is out of the first range.

14. The pattern forming method of claim 1, further comprising forming a neutral film having an affinity for the first and second polymers on the underlying film,
wherein the guide pattern is formed on the underlying film via the neutral film.

15. The pattern forming method of claim 14, further comprising:
forming a first film; and
forming a second film on the first film,
wherein the underlying film is formed on the second film.

16. The pattern forming method of claim 15, further comprising etching the neutral film by using the first portions or the second portions as a mask, when it is determined that the misalignment amount of the first portions or the second portions with respect to the guide pattern is within the first range.

17. The pattern forming method of claim 16, further comprising etching the second film by using the etched neutral film as a mask.

18. The pattern forming method of claim 17, wherein: the first film includes an insulating material; and the etching the first film comprises forming an insulating film including a groove.

19. The pattern forming method of claim 17, wherein:
the first film includes a semiconductor material; and
the etching the first film comprises forming an interconnection including the semiconductor material.

20. A semiconductor device manufacturing method comprising:
forming a guide pattern on an underlying film;
forming a block copolymer film covering the guide pattern on the underlying film, the block copolymer film including a first polymer and a second polymer;
forming a microphase-separation pattern including first portions made of the first polymer and second portions made of the second polymer by subjecting the block copolymer film to microphase separation, the first portions and the second portions being alternately arranged;
measuring a position of the guide pattern by using a scanning probe microscope;
measuring a position of at least one of the first portions or at least one of the second portions by using a scanning probe microscope;
determining whether a misalignment amount of the first portions or the second portions with respect to the guide pattern is within a first range, based on the measured position of the at least one of the first portions or at least one of the second portions and the measured position of the guide pattern;
removing the first portions or the second portions, when it is determined that the misalignment amount is within the first range; and
etching the underlying film by using the remained first portions or the remained second portions as a mask.

* * * * *

UNITED STATES PATENT AND TRADEMARK OFFICE
CERTIFICATE OF CORRECTION

PATENT NO. : 10,950,439 B2
APPLICATION NO. : 16/567738
DATED : March 16, 2021
INVENTOR(S) : Azuma Page 1 of 1

It is certified that error appears in the above-identified patent and that said Letters Patent is hereby corrected as shown below:

In the Claims

In Claim 11, Column 10, Line 64, "one of the portions" should read --one of the first portions--.

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*